United States Patent [19]
Zimmerman

[11] Patent Number: 5,909,145
[45] Date of Patent: Jun. 1, 1999

[54] VARIABLE CONTROL OF ELECTRONIC POWER SUPPLIES

[75] Inventor: David G. Zimmerman, Carnation, Wash.

[73] Assignee: Maven Peal Instruments, Inc., Stowe, Vt.

[21] Appl. No.: 08/758,341

[22] Filed: Dec. 3, 1996

Related U.S. Application Data

[63] Continuation-in-part of application No. 08/559,549, Nov. 16, 1995, Pat. No. 5,635,872.
[51] Int. Cl.$^6$ .......................................................... A03G 7/02
[52] U.S. Cl. ........................ 330/128; 330/123; 330/202; 330/285; 330/297; 381/120; 381/121
[58] Field of Search ..................................... 330/123, 128, 330/202, 285, 297; 381/61, 120, 121

[56] References Cited

U.S. PATENT DOCUMENTS 4,797,633 1/1989 Hunphrey ................................ 330/297

Primary Examiner—James B. Mullins
Attorney, Agent, or Firm—Downs Rachlin & Martin PLLC; Koda Law Office

[57] ABSTRACT

Sag of a power signal delivered to of an amplifier is controlled. The maximum amount of sag is limited to limit crossover distortion. A measuring circuit monitors an observed signal to generate a measured signal. A sag control circuit receives the measured signal and one or more input control signals, and in response generates a sag control signal. A regulator circuit receives the sag control signal and a raw power supply signal and in response generates a regulated DC power supply signal for the amplifier. The regulator circuit decreases the maximum power available to the amplifier as the sag control signal magnitude increases, so as to increase distortion and compression in the output signal (e.g., and achieve a "warm", "airy" or "forgiving" sound quality resembling or improving the sound of a vacuum tube amplifier).

30 Claims, 8 Drawing Sheets

VARIABLE CONTROL OF ELECTRONIC POWER SUPPLIES

CROSS REFERENCE TO RELATED APPLICATIONS

This is a continuation-in-part of U.S. patent application Ser. No. 08/559,549 filed Nov. 16, 1995 for Variable Control of Electronic Power Supplies, now U.S. Pat. No. 5,635,872. The content of that application is incorporated herein by reference and made a part hereof.

BACKGROUND OF THE INVENTION

This invention relates to electronic power supplies, including power supplies used in amplifiers for musical instruments and sound reproduction, and more particularly to the variable control of the static operating point and dynamic behavior of power supplies for electronic amplifiers.

Musical instrument amplifiers function to not only increase the power of an input signal presented to the amplifier in order to drive a speaker or other load but also to modify the signal through the introduction of distortion and compression. The usual method of introducing distortion and compression is to configure the amplifier to produce so much gain that one or more of the amplification stages within the amplifier are driven beyond the limits of linear operation. Simply making an amplifier with exceeding amounts of gain, however, ignores the intricate dynamics that occur when an amplifier is driven to and beyond the limit. In particular, the power supply's interaction with the amplifier's operation has a substantial impact on the sound coloration produced by the amplifier.

Audio amplifiers, for both musical instruments and sound reproduction, have power supplies that usually include a transformer having its primary winding connected to AC line voltage supplied by a power company. The transformer's secondary usually consists of three windings. The first winding is used to produce the high positive DC voltage, and it is normally considered the amplifier's main power supply. The second winding, which may either be a completely separate winding or a section of the first winding, is used to create a negative DC bias voltage for the power tubes in the amplifier. The third winding is used to supply power to the tube heaters. The present invention is concerned with the amplifier's main power supply which is referred to herein as the "power supply."

Power Supply Sag

It is known that the power supply can effect the sound produced by the amplifier. Specifically, the compression and distortion that is desirable in certain musical instrument amplifiers is caused by a "sag" in the power supply. The sound produced by amplifiers that exhibit large amounts of power supply sag is often described as "warm", "airy" and "forgiving". On the other hand, amplifiers having power supplies that do not sag very much produce sound described as "hard", "edgy" and "harsh".

All power supply circuits exhibit some amount of dynamic impedance that causes power supply sag. When the current drawn from a power supply increases, the dynamic power supply impedance causes the average level of the voltage produced by the power supply to decrease, or sag. This decrease in voltage is due to the increase in current drawn from the supply that causes an IR drop across the power supply impedance. The amount that the power supply's DC level sags for a given amount of current drawn from the supply is dependent on the power supply impedance. This impedance is dependent on the resistance of the transformer's primary and secondary windings, the impedance of rectifiers, and the values of smoothing circuit components.

The time behavior of power supply sag is also dependent on the power supply impedance. The notable aspects of the time behavior of power supply sag are 1) the rate at which the output of the power supply decreases when the current drawn from the power supply increases, i.e. sag rate, and 2) the rate at which the output of the power supply increases back up to its DC level when the current drawn from the power supply decreases, i.e. recovery rate. Vacuum tube rectifiers exhibit a relatively large dynamic impedance when compared to solid state rectifiers. Replacing modern solid state rectifiers with old style vacuum tube rectifiers has become commonplace when the compressive sound of 1950's and 1960's style amplifiers is desired. The large vacuum tube rectifier impedance causes the decrease in power supply voltage to become quite pronounced when a large amount of current is drawn from the supply. The average level of the power supply voltage can decrease by 20% or more in some cases. This large decrease limits the maximum amount of power an amplifier can deliver, thereby compressing the output signal and causing distortion in the amplifier's output.

The disadvantages of vacuum tube rectifiers include size, expense, frequent need of replacement, and the need for separate high current filament supplies that dissipate high amounts of heat. Additionally, the current capacity of most available vacuum tube rectifiers is so limited that some high power amplifiers require two or more of these rectifiers. To avoid these problems with vacuum tube rectifiers, some manufacturers include a large resistor in series with the power supply output to increase the power supply's dynamic impedance while still utilizing solid state rectifiers. Another method of increasing the power supply's dynamic impedance while using solid state rectifiers has been to wind the secondary of the power supply transformer with very high resistance wire, effectively placing a large resistor in series with the power supply output.

While increasing the dynamic impedance of a solid state rectified power supply enables an amplifier to produce sonic characteristics similar to that of older amplifiers, high power supply impedance greatly reduces the maximum amount of power that an amplifier can deliver to a load, (especially at the low end of the audio spectrum). To avoid this problem, some manufacturers include two sets of power supply rectifiers, vacuum tube and solid state. The musician can then switch between these two sets of rectifiers to make the amplifier sound in two different ways. In power supplies utilizing solid state rectifiers with a fixed resistor in the power supply, some amplifiers allow the resistor to be switched in and out of the circuit. Both the multiple rectifier and the fixed power supply resistor approaches only allow the musician to choose between two amounts of power supply sag for a given amount of current drawn from the power supply. That is, the sag magnitude is not completely adjustable. Using a very high power variable resistor in conjunction with solid state rectifiers increases the power supply circuit's flexibility, but at very high cost, and with increased weight and space requirements. Consequently, this solution is not practical.

Regulating the Power Supply

In many sound reproduction amplifiers (e.g. home stereos) the power supplies are regulated. Regulated power supplies offer many benefits over unregulated power supplies. The first benefit of a regulated power supply is that power supply ripple is reduced. Power supply ripple can induce unwanted hum in the amplifier's output. The second advantage of regulated power supplies is that the voltage produced by the supply is independent of the voltage delivered by the power company (within limits). The operating point of the various devices within an amplifier is directly dependent on the DC level produced by the amplifier's power supply. If these operating points change, the amplifier's sound can change. Having a consistent power supply is very important in musical instrument amplifiers since repeatable amplifier behavior is desired by musicians as they travel to various locations for live performances.

The third advantage of regulated power supplies in most applications is that the dynamic impedance of these supplies is basically zero. That is, the voltage produced by the supply is independent of the current delivered by the power supply, i.e. no sag. This last property of regulated power supplies is a disadvantage when the power supply is used with a musical instrument amplifier. Therefore regulated power supplies are generally not used with musical instrument amplifiers. Many home stereo amplifiers, especially tube types, do not use regulated power supplies because the manufacturer feels that unregulated supplies add a "warmth" to the amplifier's sound.

An important modification of unregulated power supplies used in musical instruments has come from some enterprising musicians. These musicians have found that by varying the AC power delivered to an amplifier, they can dramatically change the amplifier's sound. This change in AC power is accomplished by plugging the amplifier into a variable transformer, which is then plugged into the wall outlet. By altering the AC voltage delivered to an amplifier, the basic sound and maximum signal level produced by the amplifier is changed. This alteration has been embraced in an amplifier design in U.S. Pat. No. 5,091,700 issued Feb. 25, 1992 to Smith where multiple taps on the primary of the power transformer are provided in order to produce various levels of power supply DC output voltage.

The drawback of both the variable transformer as well as the multiple tapped primary concepts is that the voltages present on the other secondary windings are being modified. Altering the negative bias voltage of the output tubes can lead to crossover distortion, or dramatically increased DC tube current. Crossover distortion is very unpleasant and not desired, while increased DC tube current can lead to premature tube failure.

To eliminate the problem of altering the negative bias and heater supplies with a multiple tapped transformer primary, these two voltages could be produced from a second transformer that does not have a multiple tapped primary. However, the use of a second transformer would dramatically increase the cost and space requirements of these supplies. Additionally, the multiple tapped primary does not allow the DC voltage produced by a power supply to be continuously variable, and adding taps to a transformer increases the cost of the transformer.

PROBLEMS ADDRESSED BY THIS INVENTION

Although sag is desirable for producing "warm" or "airy" sound effects, too much sag can be a problem. If the power supply for vacuum tube amplifiers, for example, is allowed to sag too much, the bias point of the amplifier output stage can vary significantly. If this change in bias point is large enough the output devices are turned off for a large portion of a signal's cycle. Another way to describe this situation is that the amplifier's class of operation can change from the usual class A or class AB to class B or even class C (based on Electronics Institute of America ratings). The result is a dramatic increase in crossover distortion. In some musical instrument amplifiers, a relatively small amount of crossover distortion is acceptable or even desirable. However, large amounts of crossover distortion is not desirable in musical instrument amplifiers and crossover distortion is never acceptable in any amount in a sound reproduction amplifier (e.g. home stereo). Accordingly, one problem addressed is how to avoid or limit crossover distortion in sagging power supplies.

In many amplifiers, in traditional vacuum tube amplifiers in particular, high voltage supply signals are derived from a common main power supply signal through simple passive coupling networks. If the main power supply signal sags, all of the other high voltage supply signals also sag. This situation can lead to one or more stages of the amplifier becoming improperly biased (as discussed above). Accordingly, another problem addressed is how to avoid undesired sag in some stages of an amplifier.

To emulate some of the characteristics of vacuum tube amplifiers, some transistor based musical instrument amplifiers use an alternative configuration of output devices and power supplies. Instead of using the common scheme of simply driving the load through emitter/source followers, these amplifiers include large capacitors in the signal path. Specifically, the load is driven through common emitter/source connected transistors coupled to the load through large capacitors. This configuration is very similar to a vacuum tube amplifier where the anode(s) of the output stage tube(s) are transformer coupled to the load. The output impedance of common emitter/source transistor amplifiers is relatively high and helps transistor amplifiers sound more like vacuum tube amplifiers (an ever present goal in the industry). The problem that arises in such alternative configurations, however, is that the coupling capacitors are also the power supply filter capacitors. These capacitors generally are very large, and thus prevent any significant amount of power supply sag. If these capacitors were simply made smaller to increase power supply sag, the bass response of the amplifier would suffer greatly. Accordingly, another problem addressed is how to achieve a specific sound (more like that associated with vacuum tube amplifiers) and how to achieve desirable sag for transistor based musical amplifiers.

One of the ever present desires of musicians (and hi-fi stereo enthusiasts) is increased flexibility in their amplifiers. A user of an amplifier often desires to be able to easily switch between differing amplifier characteristics, (e.g. more or less distortion, volume etc.). Musical instrument amplifier manufacturers have met the desire of increased flexibility by producing amplifiers with multiple preamplifier sections (called channels) that users can easily switch between with a footswitch (or other easily accessible device). Another problem addressed is how to control sag for respective preamplifier sections of an amplifier.

SUMMARY OF THE INVENTION

According to the invention, a control subsystem is provided for controlling sag in the power supply signal of an amplifier. More specifically, the circuit controls the decrease in the average voltage level (i.e., sag) of the power supply signal occurring when the current drawn from the power supply increases.

The sag control subsystem includes a measuring circuit, a sag control circuit, a reference circuit, and a regulator circuit,. The measuring circuit measures an observed signal and generates in response a measured signal. The sag control circuit receives the measured signal and one or more input control signals. In response the sag control circuit generates a sag control signal. The input control signals include a sag magnitude signal, an increase sag rate signal, and a decrease sag rate (i.e., sag recovery) signal. The sag magnitude signal defines a maximum magnitude for the sag control signal. The increase sag rate signal defines the rate of increase in the sag control signal. The sag recovery signal defines the rate of decrease in the sag control signal. The reference circuit generates a reference signal for the regulator circuit. The regulator circuit receives the reference signal, the sag control signal and a raw (i.e., unregulated) power supply signal. In response the regulator circuit generates a regulated DC power supply signal for the amplifier. According to the invention, the regulator circuit decreases the maximum power available to the amplifier as the sag control signal magnitude increases, so as to increase distortion and compression in the output signal (e.g., and achieve a "warm", "airy" or "forgiving" sound quality much like the sound of a vacuum tube amplifier).

In various embodiments the observed signal is the output signal from the amplifier, the output signal from the load driven by the amplifier, the DC power supply signal received by the amplifier, the raw power supply signal, a power supply signal from another power supply (which drives a different load than that driven by the amplifier), or the load signal generated by another load different than that driven by the amplifier.

According to one aspect of this invention, the maximum amount of sag is limited to prevent the power supply signal from sagging below a minimum amount. One advantage of limiting the amount of sag is that crossover distortion is limited or avoided. The sag control signal is limited so as to be cutoff or clipped using one or more diodes (e.g., zener diode, diode chain). Thus, the cutoff point is prescribed.

According to another aspect of this invention, the sag control circuit includes a plurality of sag magnitude controls. A switch positioned by an operator selects which sag magnitude control is active. In a preferred embodiment a power control system includes multiple amplifier channels. An operator (e.g., musician) selects an active channel. Such selection also selects a specific sag magnitude control. Thus, there is a sag magnitude control for each channel. Typically only one channel is active at a given time. By including separate controls the sag magnitude is already set when the amplifier channel is switched. Thus the operator need not adjust the sag magnitude each time the channel is switched. This is particularly advantageous for live music performances in which a musician switches channels during a song or performance. The desired sag magnitude is preset for each channel using the respective sag magnitude control. When an amplifier channel is selected the corresponding sag magnitude control also is selected. The sag magnitude control defines a maximum sag magnitude value. Such control is a user-adjustable control which is independent of the sag cutoff limit prescribed (e.g., by a zener diode).

According to another aspect of the invention, in an amplifier formed by multiple stages an operator can select which stages receives a sagging power supply signal (output from the sag control subsystem) and which stages receive a non-sagging power supply signal. Such switching gives an operator an additional control over amplifier output (e.g., over the sound created at a speaker load).

An advantage of the invention includes limiting crossover distortion by preventing sag from going below a minimum amount. Another advantage includes providing sag control for prescribed amplifier stages and not providing sag control to other amplifier stages coupled to the same power supply. Another advantage includes controlling sag independently for the respective channels of an amplifier. Another advantage is that sag control is provided even for amplifiers where the load is coupled through large transistors to common emitter/source connected transistors which drive the load.

These and other aspects and advantages of the invention will be better understood by reference to the following detailed description taken in conjunction with the accompanying drawings.

BRIEF DESCRIPTION OF THE DRAWINGS

FIG. 4e is a signal waveform chart of amplifier output signal of FIGS. 2 and 3 responsive to the input signal of FIG. 4a;

DESCRIPTION OF SPECIFIC EMBODIMENTS

Overview

Figure 1:
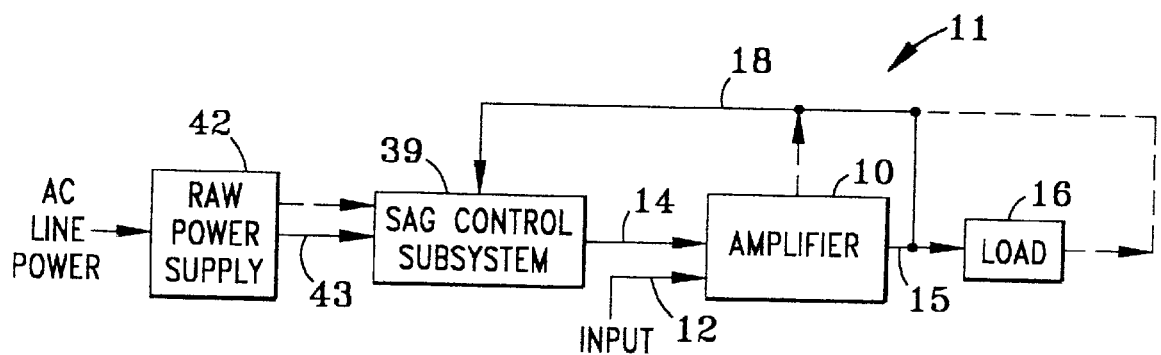
FIG. 1 is a block diagram of a power control system according to an embodiment of this invention.

FIG. 1 shows a block diagram of a power supply control system 11 according to an embodiment of this invention. The system 11 includes a power supply 42, a sag control subsystem 39, an amplifier 10 and a load 16. The power supply 42 receives an ac line power signal (e.g., via an ac outlet coupled to a utility company's power grid) and outputs a raw dc power supply signal 43 to the sag control subsystem 39. One of the functions of the sag control is to regulate the power signal and output a regulated power supply signal 14 to the amplifier 10. The amplifier 10 drives a load 16.

Another function of the sag control circuit 39 is to implement several sag control functions. Sag is a characteristic of power supplies attributable to dynamic impedance. Because power supplies exhibit dynamic impedance, when the current drawn from the power supply increases, the average voltage level decreases—or sags. As described in the background of the invention, sag is a desired characteristic in solid state amplifiers driving musical instruments because sag makes the sound of the instrument resemble that of the instrument had it been driven by a vacuum tube amplifier. The sag control circuit limits the maximum amount of sag and controls the sag increase rate and sag recovery rate for a solid state amplifier or a vacuum tube amplifier or a hybrid of the two. The sag control subsystem 39 receives a signal to be observed for defining the amount of sag added to the power supply signal. The observed signal 18 is received as the amplifier output. In alternative embodiments the observed signal is instead received from the load 16, an internal circuit of the amplifier 10 or the raw power supply 42 (as shown by the dashed lines in FIG. 1).

The power supply 42 is a conventional power supply used for driving an amplifier. The amplifier 10 is a solid state or vacuum tube amplifier. In preferred embodiments, the amplifier is a sound amplifier which drives a sound generating load device, such as a musical instrument. In an exemplary embodiment the amplifier 10 includes one or more amplifier gain stages embodied in a power amplifier, and optionally, one or more preamplifiers. The amplifier 10 may have any of a vast number of amplifier configurations. The amplifier 10 receives an input signal 12 from an input signal source (not shown). The function of the amplifier 10 is to increase the power of an input signal 12 in order to drive the amplifier load 16. Since no amplifier is perfect, the amplifier 10 also adds distortion and compression to the output signal 15.

Figure 2:
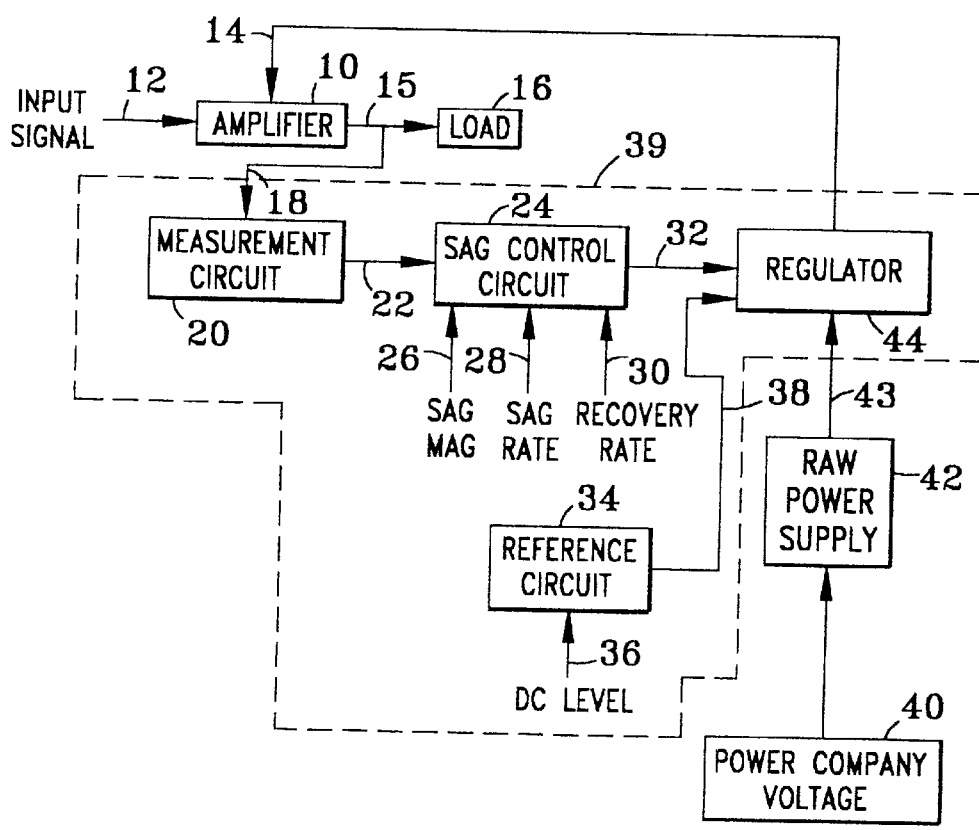
FIG. 2 is a block diagram of the system of FIG. 1 with an expanded view of the sag control subsystem.

FIG. 2 shows a block diagram of the power control system 11 of FIG. 1 with the sag control subsystem 39 shown in more detail. The sag control subsystem 39 includes a measurement circuit 20, a sag control circuit 24, a references circuit 34 and the regulator 44. The measurement circuit 20 receives an observed signal and in response generates a measured signal 22 which is output to the sag control circuit 24. In the illustrated embodiment the observed signal is the output from the amplifier 10. In alternative embodiments, the observed signal is the output signal from a given device within the amplifier 10, the output signal from the load 16 driven by the amplifier 10, the DC power supply signal 14 received by the amplifier 10, the raw power supply signal 43, a power supply signal from another power supply (which drives a different load than that driven by the amplifier), or the load signal generated by another load different than that driven by the amplifier.

In the illustrated embodiment, the amplifier output signal 15 is the observed signal 18 which is input to the measurement circuit 20. The output of measurement circuit 20 is the measured signal 22. The measured signal output 22 of the measurement circuit 20 is any of the peak, average or RMS value of the observed voltage or current. Preferably, the measurement circuit 20 produces a normalized function of the observed current or voltage.

The sag control circuit 24 generates a sag control signal 32 based on the measured signal 22 and one or more input control signals 26, 28, 30. The maximum magnitude of the sag control signal 32 is dependent on a user-adjustable sag magnitude control signal 26. The rate at which the sag control signal 32 changes from zero to its maximum magnitude when a measured signal 22 is present is dependent on the user adjustable sag rate control signal 28. The rate at which the sag control signal 32 changes from its maximum magnitude back to zero when the measured signal 22 returns to zero is dependent on the user adjustable recovery rate control signal 30.

The reference circuit 34 generates a static reference signal 38. The value of this reference signal is not dependent on the voltage provided by the power company or on the amplifier input signal 12. In an exemplary embodiment the magnitude of the static reference signal 38 is dependent on a user adjustable DC level control signal 36.

The static reference signal 38 and sag control signal 32 are input to the regulator 44 to generate the power supply output signal 14. The regulator 44 includes one or more regulator circuits for providing all of the various power requirements of the amplifier 10. For example, many solid state amplifiers require a positive and a negative power supply voltage to operate. The DC level of the regulator 44 output(s) is dependent on the value of the static reference signal 38. The instantaneous value of the regulator 44 output(s) is dependent on both the sag control signal 32 and the static reference signal 38. When the sag control signal 32 magnitude increases from zero, the magnitude of the output will decrease from the DC level to a lower level, thus tracking the sag control signal 32.

There are numerous possible regulator configurations. Typically, however, the power company voltage 40 is passed first through a simple raw power supply 42. The output 43 of the raw power supply 42 then is used as the power input to the regulator 44 in order to produce its final output(s).

As an illustration of the present embodiment's behavior, consider the scenario where (i) the measured signal 22 is the positive peak value of the observed signal 18, (ii) the input signal 12 has been zero for a long period, (iii) the input signal 12 changes to a constant amplitude for a period, then returns to zero. When the input signal 12 changes from zero to its new varying state, the measured signal 22 produced by measurement circuit 20 changes from zero to the peak value of the observed signal 18. Since the measured signal 22 has increased, the sag control circuit 24 starts to increase the sag control signal 32 magnitude. The rate at which the sag control signal 32 magnitude increases is dependent on the level of the user adjustable sag rate control signal 28. After a period of time dependent on the user adjustable sag rate control signal 28, the sag control signal 32 magnitude increases to its maximum value and remains at this value until the measured signal 22 changes. The magnitude of this maximum value is dependent on the user adjustable sag magnitude control signal 26. According to an aspect of this invention, the sag control signal 32 may be cutoff before reaching the maximum sag magnitude defined by the sag magnitude control 26. In such instance, the sag control signal 32 is clipped. When the input signal 12 returns to zero, the measured signal 22 also returns to zero. As this occurs, the sag control circuit 24 will begin to decrease the sag control signal 32 back to zero at a rate that is dependent on the user adjustable sag recovery control signal 30.

Continuing with this example, when the sag control signal 32 is zero, the regulator 44 is producing DC output(s) that are dependent on the static reference signal 38. The magnitude of the static reference signal 38, and therefore the DC output of the regulator 44, is dependent on the user adjustable DC level control 36. As the sag control signal 32 magnitude begins to increase from zero to its maximum, the regulator 44 output(s) will track the sag control signal 32 in an inverse relationship. That is, as the sag control signal 32 magnitude increases, the magnitude of the regulator 44 output(s) will decrease. Conversely as the sag control signal 32 returns to zero, the output(s) will return to their static or DC values.

The net result of this described behavior is that as the input signal 12 to the amplifier 10 increases, the maximum power available to the amplifier 10 decreases due to a decrease in the power supply input 14 (regulator output). This decrease in available power causes increased distortion and compression in the signal that appears at the amplifier load 16.

Circuit Schematics

Figure 3:
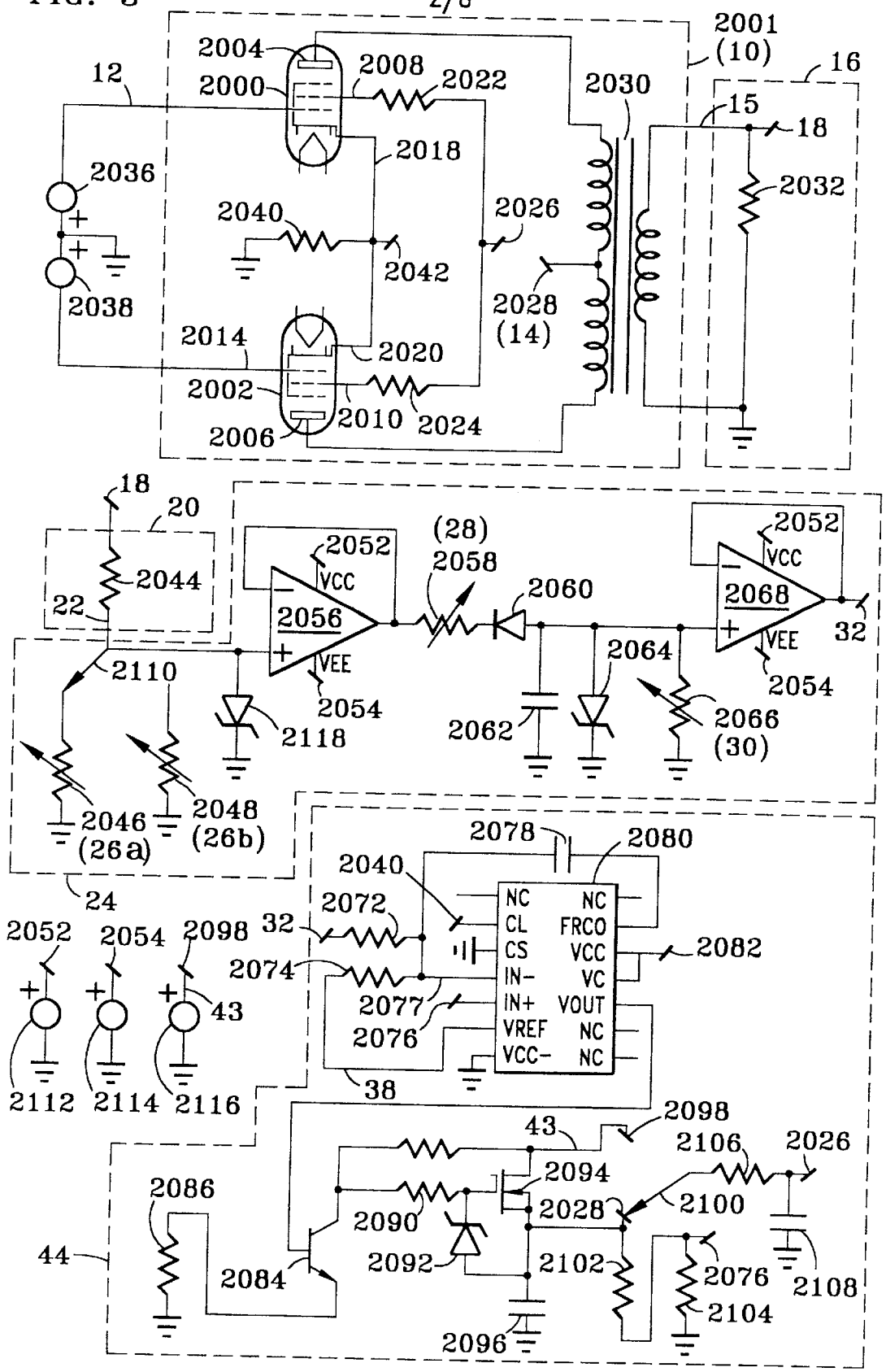
FIG. 3 is a circuit schematic of the system of FIG. 2 according to an embodiment of this invention.

FIG. 3 shows an exemplary embodiment of the invention for a push-pull type amplifier 2001 using pentodes as the amplifying devices. The amplifier 2001 corresponds to the amplifier 10 of FIG. 1. While this type of amplifier circuit is found in the power stage of many commercially available amplifiers, the current circuit may also be used in a preamplifier circuit using low power pentodes. The load 16 of the amplifier 2001 in this and all further embodiments described herein will be shown as a simple resistance 2032. However, it is to be understood that the use of a resistive load does not imply that the present invention is only capable of functioning with amplifier loads that are simple resistances, and other types of loads may also be applied.

Plates 2004 and 2006 of pentodes 2000 and 2002 are coupled in a push pull arrangement through center-tapped transformer 2030 to load 2032. The signal inputs 12 and the signal amplification and bias circuits of a complete amplifier assembly are represented by voltage supplies 2036 and 2038. The plate voltage for the pentodes 2000 and 2002 is connected to center tap 2028 of transformer 2030. The screen voltage for the pentodes 2000 and 2002 is connected to screen grids 2008 and 2010 via screen grid resistors 2022 and 2024. The cathodes 2018 and 2020 are connected to current sampling resistor 2042.

In this embodiment the observed signal 18 is the voltage across load resistor 2032. This voltage signal 18 is attenuated by a resistive divider made up of resistor 2044 and either one of potentiometer 2046 or potentiometer 2048. Which potentiometer is in use is selected by switch 2110. Switch 2110 is a simple switch, or part of the amplifier's channel switching network, (for example a switch in a relay). The resistor 2044 serves as the measurement circuit 20 of FIG. 1. The potentiometers 2046 and 2048 are part of the sag control circuit 24 and implement independent sag magnitude controls (26a, 26b). A zener diode 2118 limits the voltage presented to operational amplifier 2056. Since the sag generation circuit is essentially a negative peak detector, the positive half of the output waveform of amplifier 2001 is not needed. Zener diode 2118 shorts the positive part of the observed signal while limiting the negative part to a maximum magnitude equal to the zener diode's 2118 breakdown voltage. This limiting prevents the operational amplifier 2056 from being overdriven on large signals. Operational amplifier 2056 acts as a unity gain buffer driving the sag control signal generation circuit. DC supply signal 2052 and bias signal 2054 are supplied from dc power sources 2112 and 2114.

Diode 2060 and capacitor 2062 serve as a negative peak detector (implying that in this embodiment, the negative peak of the observed and attenuated voltage will be the measured signal as discussed in the previous section). The function of the peak detector has been modified by the addition of variable resistor 2058 which limits the rate at which capacitor 2062 can charge. Variable resistor 2058 acts as the sag rate signal 28 adjustment in this embodiment of the present invention. Variable resistor 2066 determines the rate at which capacitor 2062 discharges, hence variable resistor 2066 acts as the recovery rate signal 30 adjustment.

Zener diode 2064 limits the magnitude of the sag control signal to some preset negative maximum. The limiting action of zener diode sets a lower limit for how low the power supply output voltage will sag. In an alternative embodiment a string of regular diodes are used instead of the zener diode 2064. In such alternative embodiment (not shown), the first diode is has its cathode connected to circuit node formed by the junction of diode 2060's anode and capacitor 2062. The second diode in the string has have its cathode connected to the first diode's anode. The last diode in the string has its anode connected to ground. A variable lower limit for the power supply output is created by selecting which diode in the string has its anode connected to ground.

The operational amplifier 2068 acts as a buffer to isolate the sag control signal generation circuit 24 from the remainder of the power supply. The output of operational amplifier 2068 is the sag control signal 32 described in the previous section.

In the current embodiment, the regulator 44 is implemented by a common voltage regulator integrated circuit 2080, for example a Texas Instruments $\mu$A723. The voltage reference circuit 34 is an internal reference of the voltage regulator integrated circuit 2080. The sag control signal 32 and reference voltage 38 are input to the regulator integrated circuit 2080 through resistors 2074 and 2072 to generate a regulator tracking voltage 2077 (the voltage at the inverting terminal of voltage regulator integrated circuit 2080).

In the embodiment shown in FIG. 3 the regulator 44 is a linear series regulator. The output signal 43 of the raw power supply is represented as the output of a voltage source 2116. A differential amplifier internal to the voltage regulator integrated circuit 2080 is used to create a feedback loop which causes the output of the regulator to track the regulator tracking voltage 2077. Capacitor 2078 is used to stabilize the feedback loop. Transistor 2084 and resistors 2086 and 2088 amplify the output and shift the DC level of voltage regulator integrated circuit 2080 high enough to drive the regulator pass device. MOSFET 2094 is used as the pass device of the power supply. To prevent damage, zener diode 2092 is used to limit the gate to source voltage of the MOSFET 2094. To prevent oscillations, resistor 2090 and capacitor 2096 are used to lower the high frequency gain of the voltage regulator. The regulator output is the voltage across capacitor 2096. Resistors 2102 and 2104 are used to create the regulator feedback circuit. The voltage appearing across resistor 2104 is connected back to the noninverting input of the voltage regulator integrated circuit 2080, completing the feedback connection. In the illustrated embodiment, the DC level (e.g., corresponding to signal 36 of FIG. 1) of the sagging power supply output is not user adjustable. In other embodiment's such DC level is adjustable.

The regulator 44 output signal 2028 (corresponding to signal 14 of FIG. 1) is connected directly to the center tap of transformer 2030. Resistor 2106 and capacitor 2108 form an RC low pass filter. This filter's output 2026 is the voltage appearing across capacitor 2108. The voltage output 2026 is connected to screen grids 2008 and 2010 of pentodes 2000 and 2002 via screen resistors 2022 and 2024. The filter's input is selected with switch 2100 to be either the output 2028/14 of the sagging regulator or the output 43 of the raw power supply 2116. By using switch 2100 the user is able to switch between having a screen voltage which generally sags a lot (the output of the sagging power supply) or generally sags a little (the raw power supply output 2116).

The total current drawn by the pentodes 2000 and 2002 is monitored with the cathode resistor 2042. The voltage drop across this resistor is the voltage appearing at node 2040. This voltage is connected to the voltage regulator integrated circuit's 2080 current limit input. The voltage regulator integrated circuit 2080 will limit the amount of current delivered by the power supply to a preset maximum determined by the value of the cathode resistor 2042. This current limiting is used to protect the power supply in case of a tube or other device failure.

Circuit Dynamics

Figure 4A:
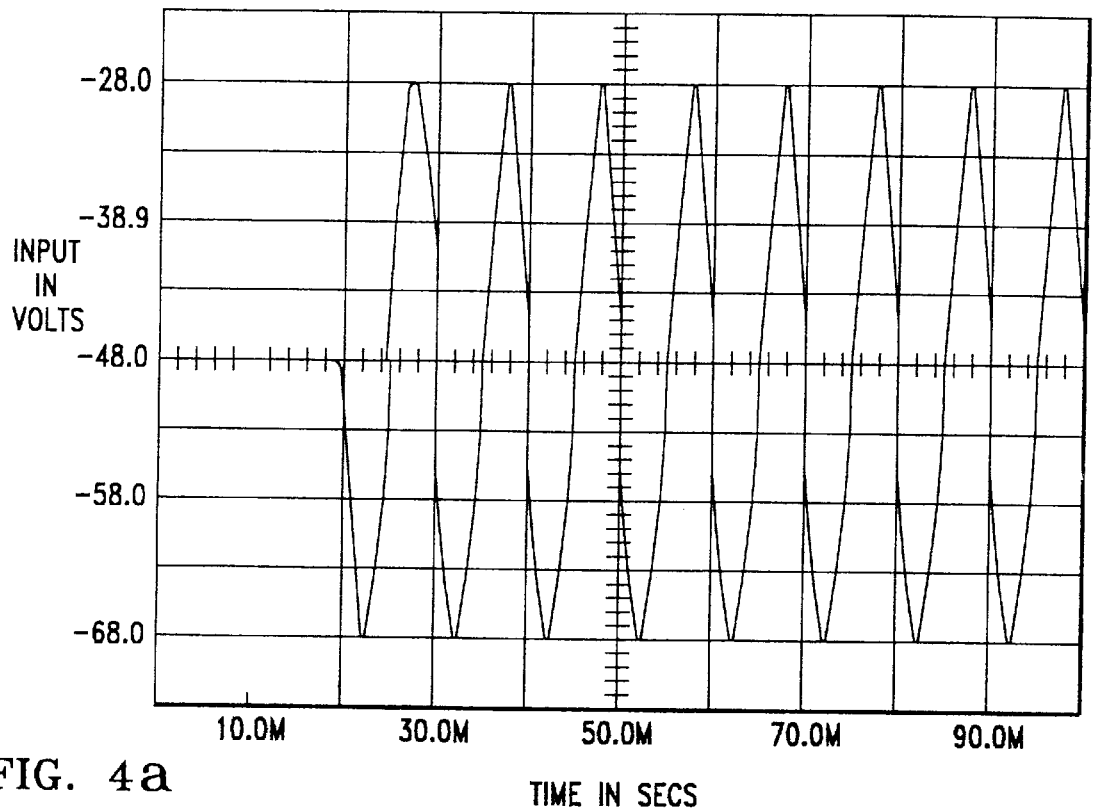
FIG. 4a is a signal waveform chart of a sample input signal received at the amplifier of FIG. 3.

The dynamic behavior of the specific embodiment shown in FIG. 3 is now discussed. Consider the scenario where the signal input to the amplifier circuit 2001 is zero for a period of time and is then a sine wave. As was mentioned previously, the signal input, preamplifier, phase splitting and bias functions of a complete amplifier are lumped into the voltages supplies 2112 and 2114. The signal then presented to the control grid 2014 of the pentode 2002 is shown in FIG. 4a. The signal presented to the control grid 2012 of the pentode 2014 is 180 degrees out of phase with the signal shown in FIG. 4a.

The voltage appearing across the load resistor 2032 is a sine wave that is distorted somewhat by the nonlinearity of the pentodes 2000 and 2002. Initially, the voltage across the capacitor 2062 will be zero. During the first negative excursion of the load voltage, the capacitor 2062 begins to accumulate a negative voltage. The rate that the capacitor 2062 charges is dependent on the value of a variable resistor 2058. In this embodiment, the observed signal (the load voltage) is a low impedance signal, therefore the impedance of the selected potentiometer 2046 or 2048 is much lower than the range of values of the variable resistor 2058. Therefore, the potentiometer 2046 or 2048 determines the maximum negative value that the capacitor 2062 will charge to, but the rate at which the capacitor 2062 charges is basically determined by the value of the variable resistor 2058.

As the load voltage begins to increase from its maximum negative value attained in this first cycle, the voltage appearing at the cathode of the diode 2060 will eventually exceed the voltage across the capacitor 2062. When this situation occurs, the diode 2060 turns off, effectively isolating the capacitor 2062 from the load voltage, the selected potentiometer 2046 or 2048 and the variable resistor 2058. The voltage stored in the capacitor 2062 then begins to discharge through the variable resistor 2066 (the recovery rate control 30). The rate at which the capacitor 2062 discharges is dependent on the value of the variable resistor 2066.

Figure 4B:
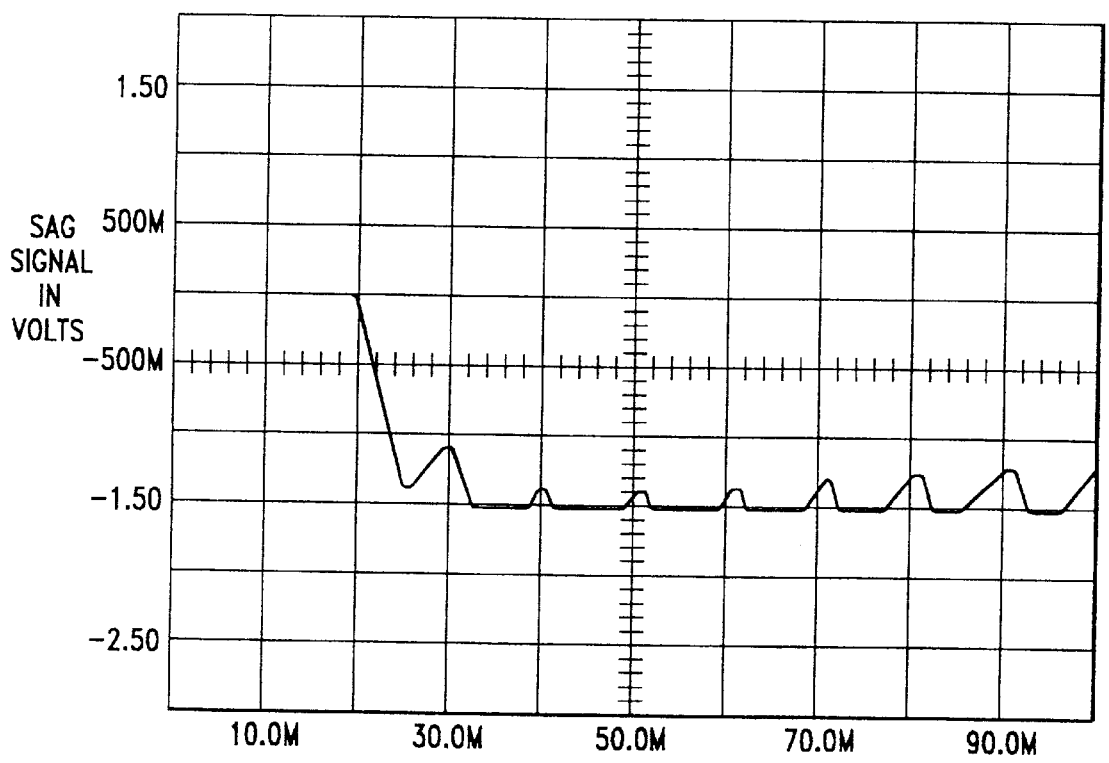
FIG. 4b is a signal waveform chart of the sag control signal generated by the sag control circuit of FIGS. 2 and 3.

Because the operational amplifier 2068 is configured as a follower, its output is very nearly an exact copy of the voltage appearing at its noninverting terminal. The signal appearing at the output of the operational amplifier 2068 is the sag control signal 32 previously discussed. The sag control signal 32 is shown in FIG. 4b. Each time the input voltage moves toward its negative maximum, the sag control signal 32 also begins to decrease. The slope of the downward trending portions of the graph in FIG. 4b is determined by the value of the variable resistor 2058. The maximum negative voltage attained by the sag control signal 32 is determined by the selected potentiometer 2046 or 2048. The slope of the upward trending portions of the graph in FIG. 4b is determined by the value of variable resistor 2066. The zener diode 2064 serves as a cutoff limiting the maximum amount of sag applied to the power signal. In FIG. 4b the sag control signal is cutoff at −1.50 volts. In such example, the maximum sag magnitude defined by the sag magnitude control is not reached. The maximum sag magnitude instead is defined by the zener diode 2064.

Figure 4C:
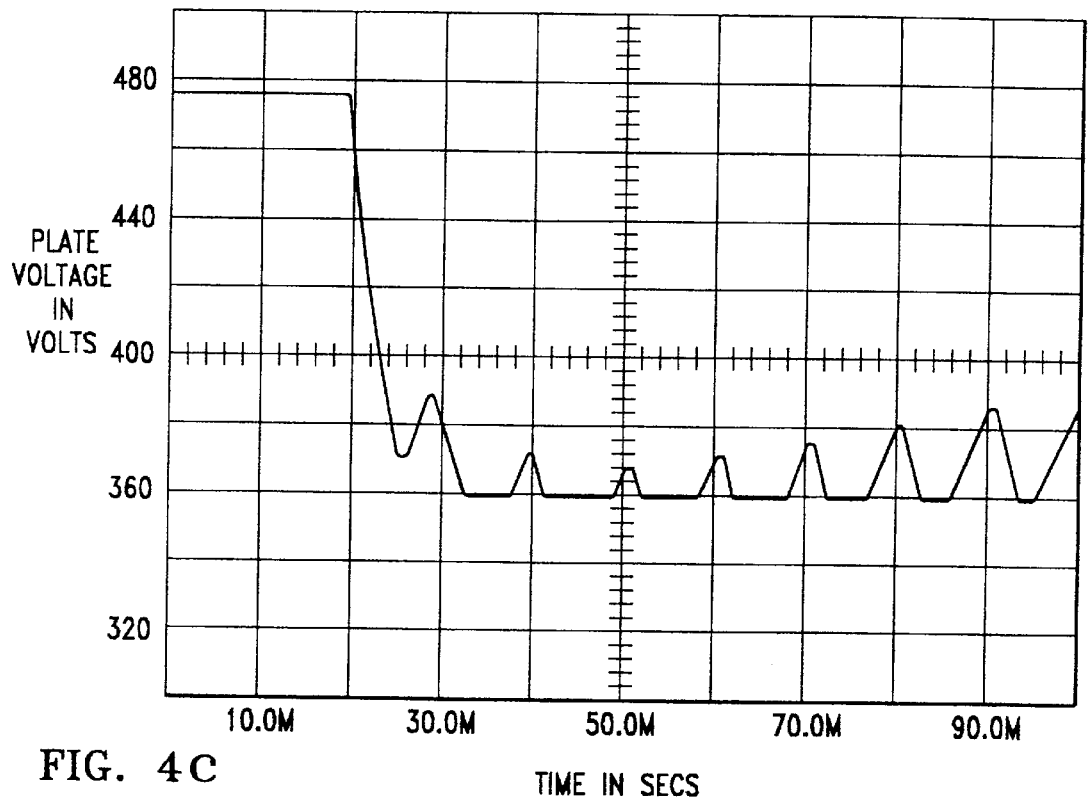
FIG. 4c is a signal waveform chart of the sagging power supply signal output from the regulator FIGS. 2 and 3.
Figure 4D:
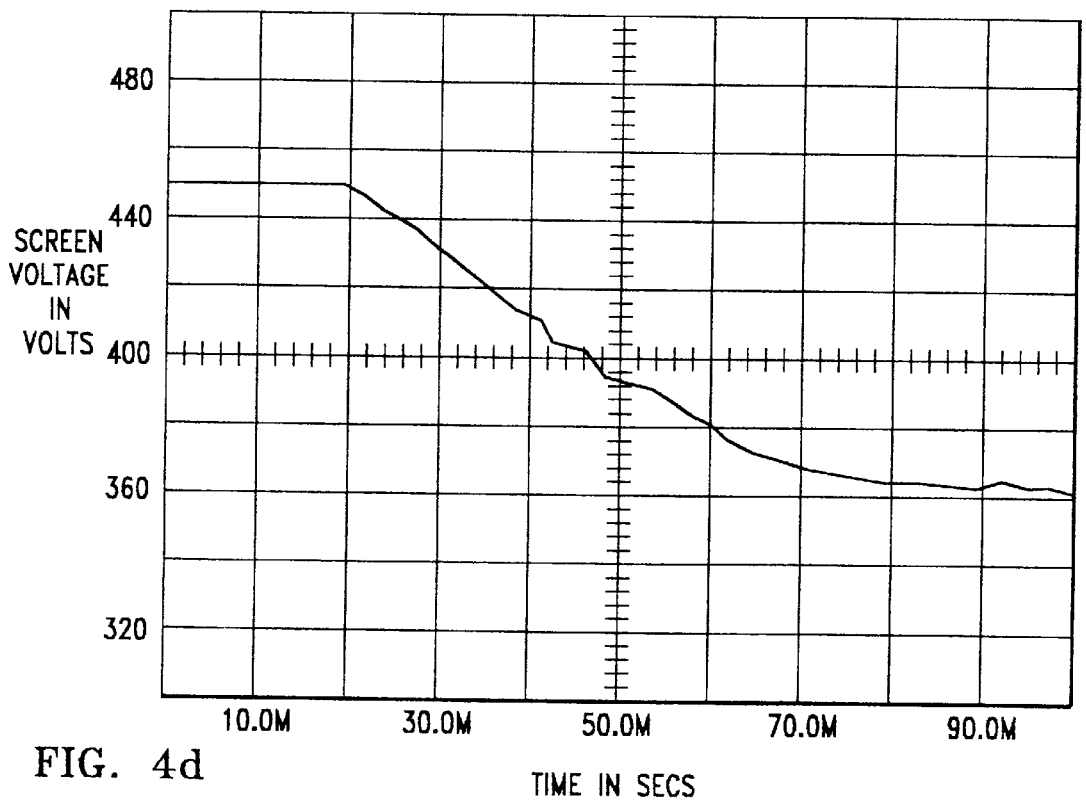
FIG. 4d is a signal waveform chart of the screen voltage of the components shown in FIG. 3 which correspond to the voltage across the capacitor 210.

The sag control signal 32 is added to the reference voltage through resistor 2072. The regulator circuit 44 then tracks the regulator tracking voltage 2077 as previously discussed. The regulator's circuit output 2028 (14) is used as the plate voltage in the amplifier 2001. Such output signal 2028/14 is shown in FIG. 4c. The plate voltage decreases from its DC value, directly tracking the sag control signal. The screen voltage is the voltage across the capacitor 2108. Since this voltage is filtered by a low pass filter made up of the resistor 2106 and the capacitor 2108, this voltage follows the plate voltage in its downward trend in a smoother manner. Note that the sag in regulated power signal 2028/14 cuts off at 360 volts. Thus, 360 volts is the minimum voltage (e.g., maximum amount of power supply sag is limited at 360 V).

Figure 4E:
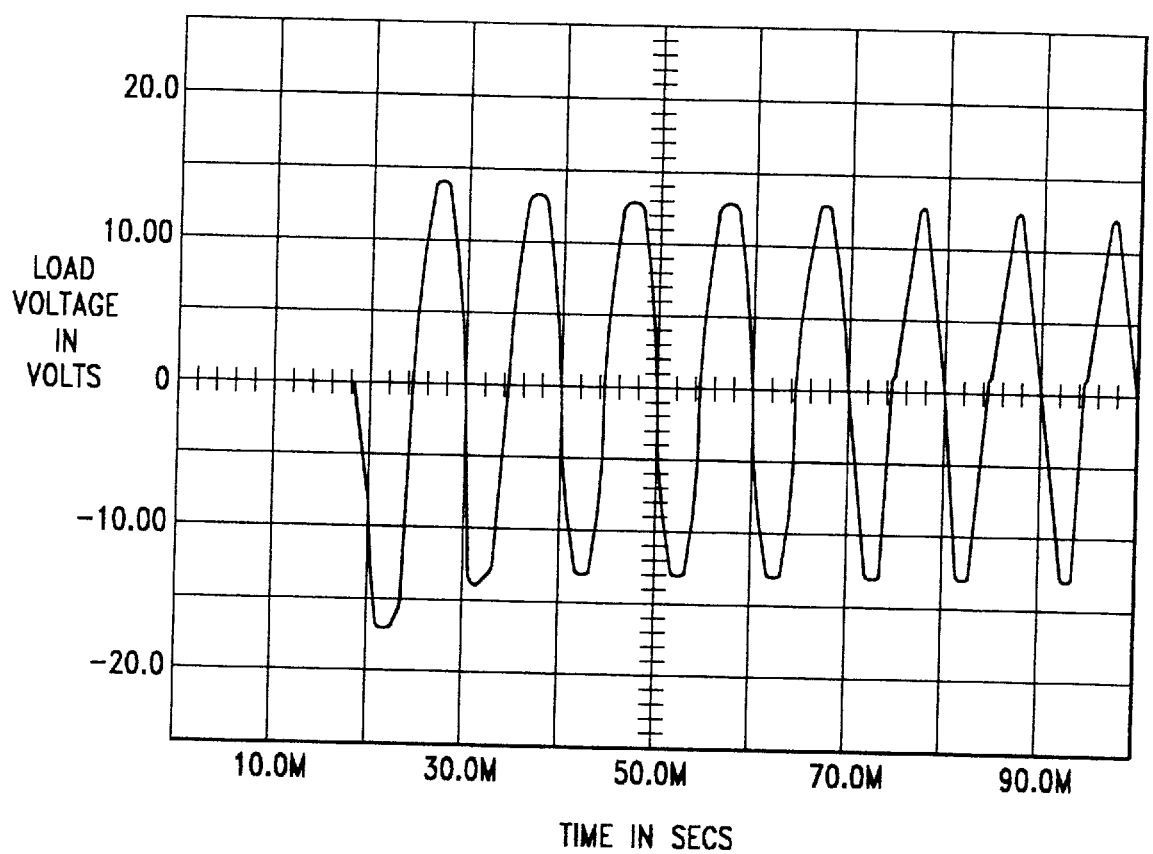

The net effect on the amplifier's operation can be seen in FIG. 4e, which is a graph of the voltage appearing across load resistor 2032. As can be seen in the first few cycles, the tops of the sine waves are basically lopped off by the decrease in the plate supply voltage. As the plate and screen supply voltages continue to decrease, the peak negative and positive values of the load voltage continue to decrease until levelling off. This decrease in maximum load voltage leads to the slight decrease in the magnitude in the sag control signal shown in FIG. 4b.

As can be seen from FIG. 4e, the distortion and compression caused by a power supply with apparently large dynamic resistance is clearly present.

Alternative Embodiment

Figure 5A:
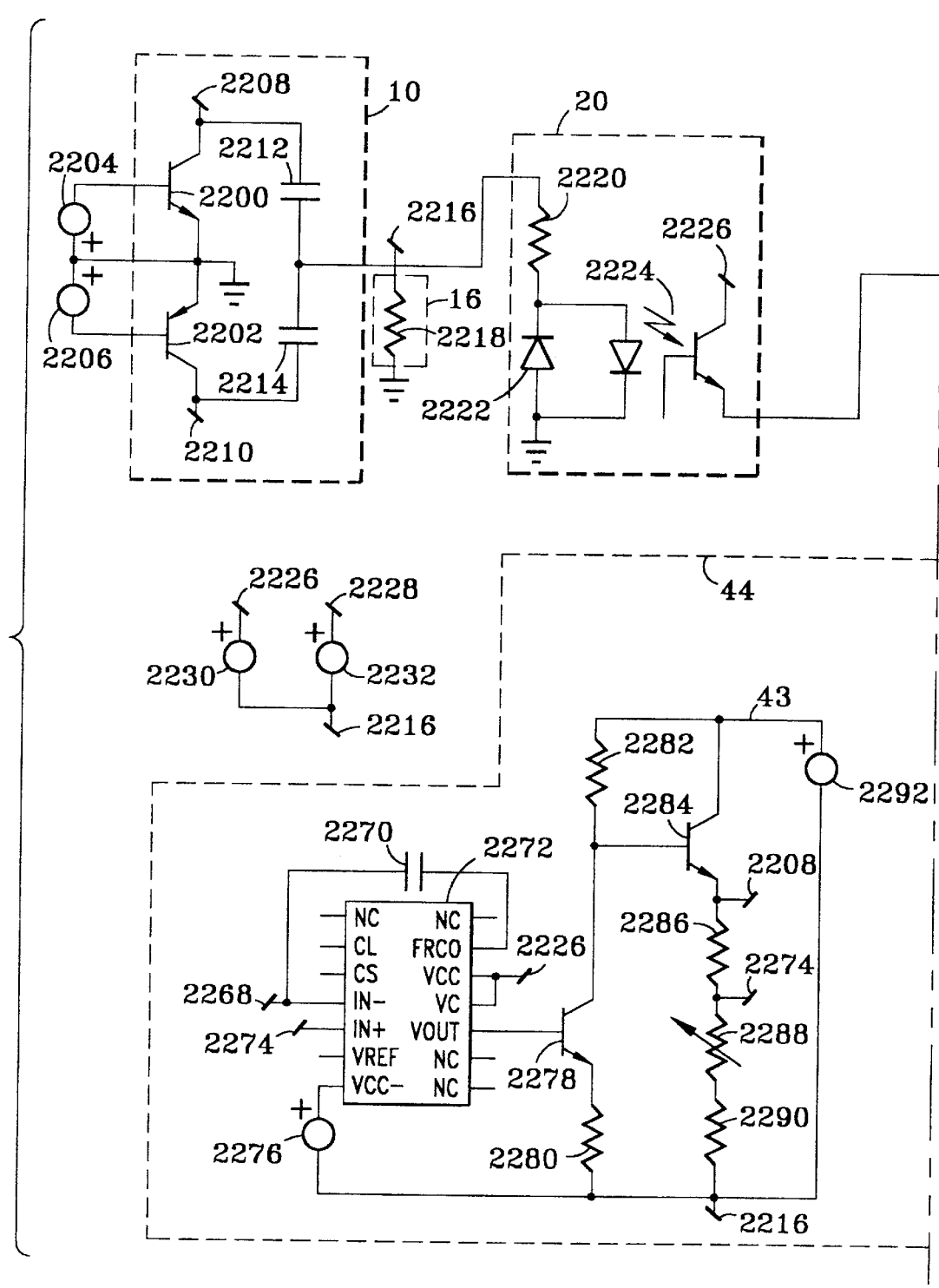
FIGS. 5a and 5b are circuit schematics of the system of FIG. 2 according to an alternative embodiment of this invention.
Figure 5B:
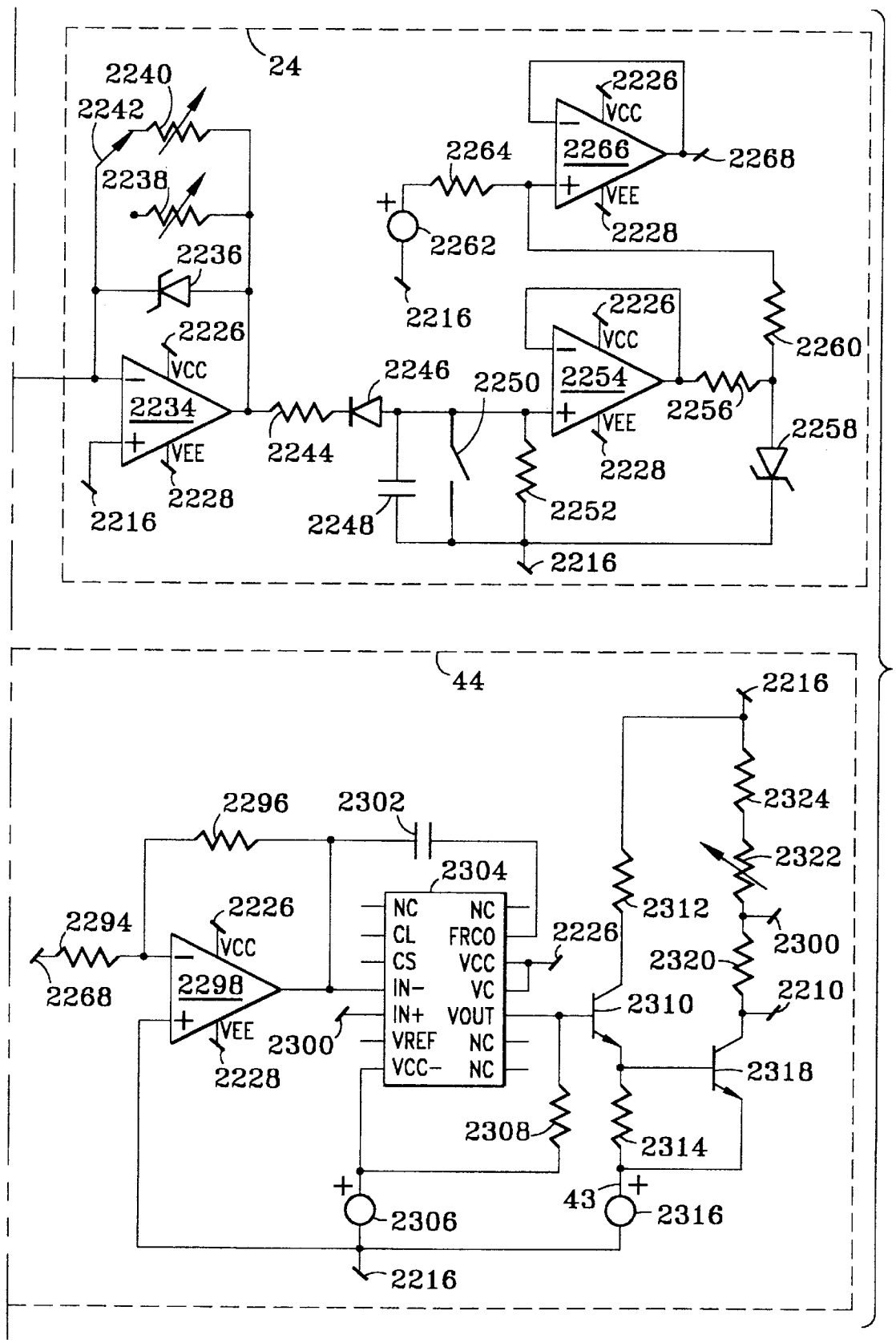

FIG. 5 depicts another embodiment of the present invention. The amplifier used in this embodiment is a complementary transistor amplifier requiring both positive and negative voltage supplies. Additionally, the amplifier output transistors 2200 and 2202 are used in a common emitter configuration, and are coupled to the load 2218 through capacitors 2212 and 2214.

Normally, an amplifier configured as shown would have a fairly conventional dual output power supply consisting of a center-tapped transformer, a diode bridge and filter capacitors. The positive output would be filtered by capacitor 2212 and connected to transistor 2200 at node 2208. The negative output would be filtered by capacitor 2214 and connected to transistor 2202 at node 2210. The center-tap of this supply would not be connected to ground, but rather to node 2216 (the positive load terminal). Here the two supply voltages are not referenced to ground, but would be floating on the load voltage.

In the current embodiment, the raw power supply signals 43 are shown as outputs from power supply voltage sources 2292 and 2316. Instead of connecting these voltage sources directly to the output transistors 2200 and 2202, these voltage sources are used as the raw power supply inputs to the sagging power supplies. The sagging power supplies also use the voltage present at node 2216, which is the voltage delivered to the load 2218 as the reference point. Therefore these sagging power supplies are also floating on the load voltage. The observed signal in this embodiment is the voltage across load resistor 2218. The dilemma that must be solved with this circuit configuration is that the observed signal is the virtual ground point for the power supplies. To solve the problem, an opto-isolator 2224 is used to isolate the ground referenced observed signal appearing across the load 2218 from the load voltage referenced signals that appear in the sagging power supplies. Since the observed signal is AC only, an isolation transformer can be substituted for an opto-isolator.

The input diode of opto-isolator 2224 is essentially current driven. Resistor 2220 is used to turn the load voltage into a current. Since there is no DC component of the load voltage, the opto-isolator is biased so that it is normally off (that is no DC current flows through either the photodiode or the detecting phototransistor). In this configuration, the opto-isolator can only pass the positive half of load voltage signals. Diode 2222 is used to shunt the negative part of the load voltage signals to ground, thereby protecting the opto-isolator. Since the sag circuit is a peak detection circuit, loosing one half of the load signal is acceptable. All signals up to and including the current passing through the photodiode portion of the opto-isolator are ground referenced. All signals appearing from the phototransistor onward are referenced to the voltage appearing at node 2216 (the load voltage).

The load voltage induced current passing through the photodiode induces a proportional emitter current to flow in the detecting phototransistor. This emitter current is the output of the opto-isolator. This current is converted to a voltage by operational amplifier 2234 (which is power by floating voltage sources 2230 and 2232) as follows. The inverting input of operational amplifier 2234 is at virtual (floating) ground and has an extremely high input impedance. Temporarily ignoring zener diode 2236, any current that flows from the phototransistor must flow through either variable resistor 2238 or variable resistor 2240, and then to the operational amplifier 2234 output node. Since the left node of the selected variable resistor is at floating ground, the right node (and hence the output of the operational amplifier 2234) must be at a voltage equal to the current flowing through the variable resistor multiplied by the resistance of the variable resistor. In this way, the current output of the opto-isolator 2224 is turned into a proportional voltage output of the operational amplifier 2234. Since the output current of the opto-isolator 2224 is always positive (current flows out of the emitter) the output of the operational amplifier 2234 is always negative. Since the sag circuit is basically a negative peak detector, this negative only operational amplifier voltage is all that is needed for the sag circuit to operate properly.

Variable resistors 2238 and 2240 determine the gain of the current to voltage converter. Lower values of resistance will cause the output voltage of operational amplifier 2234 to decrease for a given input current. From the user's perspective, these two variable resistors are the sag magnitude controls of the sagging power supply. Which variable resistance is in use is determined by switch 2242. This switch 2242 can be either a simple switch, on a panel for example, or can be part of the channel switching network of the amplifier. In the latter case, the amount of power supply sag can be independently assigned to the different channels in the amplifier. Zener diode 2236 is used to limit the output voltage that operational amplifier 2234 attempts to produce. This limiting function keeps the operational amplifier 2234 from being overdriven into an undesirable condition and possibly damaged.

Diode 2246 and capacitor 2248 form a negative peak detector circuit. In this embodiment, the voltage appearing across capacitor 2248 is the sag control signal described above. The rate at which capacitor is allowed to charge is determined by the value of resistor 2244. In other words, resistor 2244 determines the sag rate of the sagging power supply, and in this embodiment the sag rate is fixed and not user controllable. The value of resistor 2252 determines how quickly the voltage across capacitor 2248 falls back to zero. In other words, resistor 2252 determines the recovery rate of the sagging power supply, and in this embodiment the recovery rate is fixed and not user controllable. When switch 2250 is open it has no affect on the sag control signal. When the switch 2250 is closed, the sag control signal is forced to zero volts. The use of switch 2250 allows the user to easily switch between two amounts of power supply sag; zero power supply sag when the switch 2250 is closed and whatever amount is selected by the sag magnitude control currently in used (variable resistor 2238 or 2240).

Operational amplifier 2254 is used as a buffer for the sag control signal generation circuit. Resistor 2256 and zener diode 2258 are used to limit the maximum value of the sag control signal, thereby establishing a lower limit that the sagging power supplies will not sag below. This preset minimum power supply voltage is dependent on the breakdown voltage of zener diode 2258.

In the current embodiment, the reference voltage is modelled by voltage source 2262. The reference voltage and the sag control signal are added together through resistors 2260 and 2264 by operational amplifier 2266. The voltage appearing at the operational amplifier's 2266 output node 2268 is used as the tracking voltage for the positive and negative sagging power supplies.

In the embodiment shown in FIG. 5, both the positive and negative sagging power supplies are linear series regulators. The positive sagging power supply is built around voltage regulator integrated circuit 2272. In the current embodiment a Texas Instruments μA723 type voltage regulator integrated circuit is used. The output of the raw positive power supply is represented by voltage source 2292. The differential amplifier internal to the voltage regulator integrated circuit 2272 is used to create a feedback loop causing the output of the regulator to track the regulator tracking voltage (which is the voltage present at node 2268). Capacitor 2270 is used to stabilize the feedback loop. Transistor 2278 and resistors 2280 and 2282 amplify the output and shift the DC level of voltage regulator integrated circuit 2272 high enough to drive the regulator pass device. BJT 2284 is used as the pass device of the power supply. The output of the regulator is the voltage appearing at node 2208 which is connected to the amplifier coupling capacitor 2212 and the collector of amplifier output transistor 2200. Capacitor 2212 not only couples the amplifier output to the load but also helps stabilize the output of the sagging power supply. Resistors 2286 and 2290 and variable resistor 2288 are used to create the regulator feedback circuit. The voltage appearing at node 2274 is connected back to the noninverting input of the voltage regulator integrated circuit 2272, completing the feedback connection.

The DC level of the sagging power is adjusted via variable resistor 2288. The lower the value of this resistance, the higher the DC level of the power supply output. Since the amplifier requires two voltage supplies (positive and negative) and both of these supplies should be producing the same magnitude of voltage, variable resistor 2288 in the positive power supply and variable resistor 2322 in the negative power supply should preferably be two halves of a dual variable resistor.

The output of the negative sagging power supply should be exactly the same voltage as the output of the positive sagging power supply, except reversed in sign. To accomplish this, the tracking voltage appearing at node 2268 is inverted. Operational amplifier 2298 and resistors 2294 and 2296 (which are the same value) are used to invert the tracking voltage for the negative sagging power supply. The remainder of the negative sagging power supply is the dual of the positive sagging power supply, with one exception. The output of the voltage regulator integrated circuit 2304 can only source current, it cannot sink it. Resistor 2308 and negative voltage source 2306 are used to create a sinking current path for the base current of transistor 2310. The amount of current sunk through resistor 2308 is determined by the output voltage of the voltage regulator integrated circuit 2304.

Sag Control in Amplifier Stages and Amplifier Channels

Figure 6:
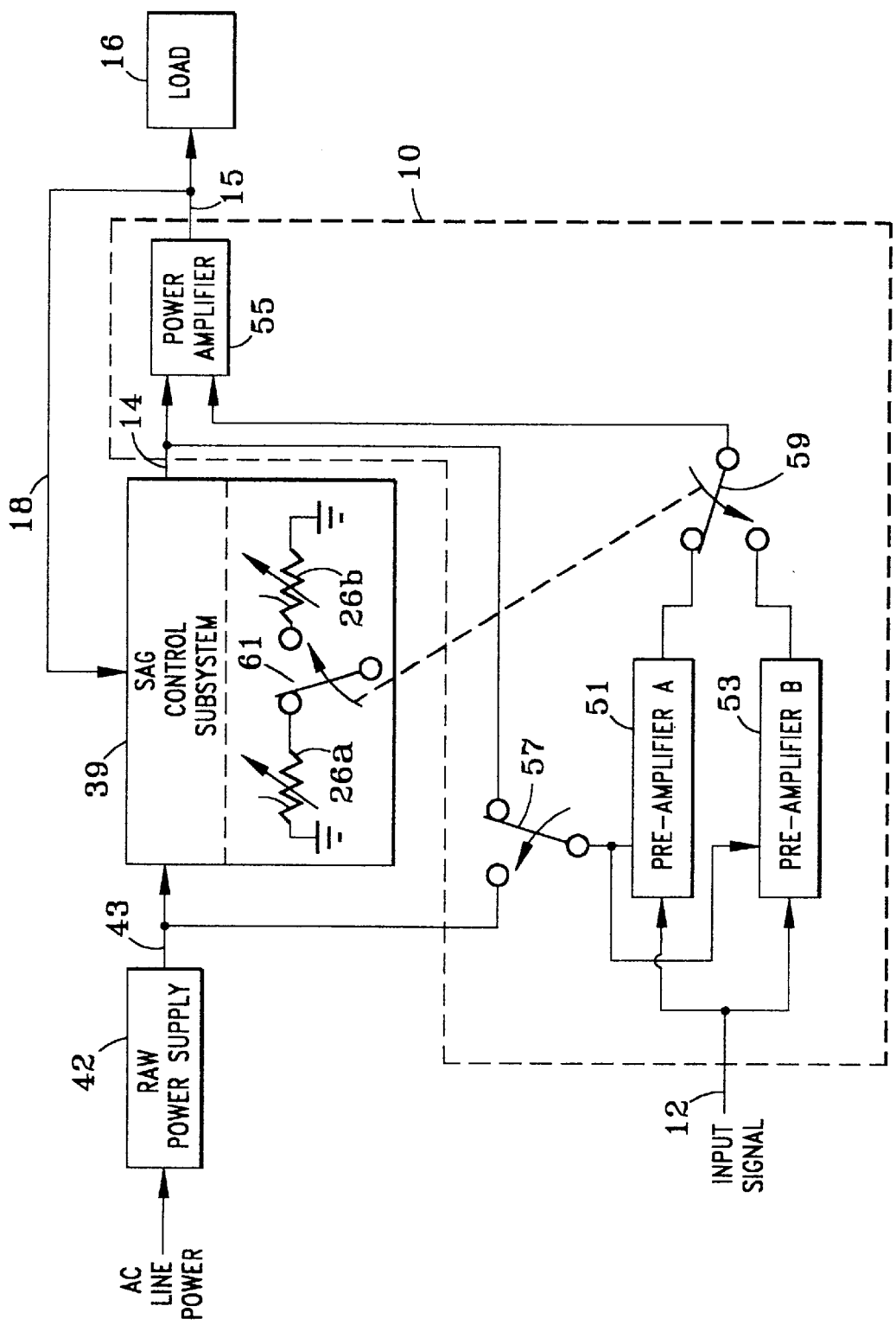
FIG. 6 is a block diagram of the power control system of FIG. 1 for an embodiment in which the amplifier includes two stages and two channels.

FIG. 6 shows a power control system 10 in which the amplifier 10 includes two stages. One stage is formed by two pre-amplifiers 51, 53. The other stage is formed by a power amplifier 55. In the embodiment shown the power amplifier 55 receives the sagging power supply signal 14 output from the sag control subsystem 39. According to an aspect of this invention, a switch 57 selects whether the pre-amplifier stage receives the raw power supply signal from the power supply 42 or the sagging power supply signal from the sag control subsystem 39. An operator selects the switch 57 position. With switch 57 in the position one position shown, both stages of the amplifier 10 receive the sagging power supply signal 14. With switch 57 in the opposite position, only the power amplifier stage 55 receives the sagging power supply signal 14. Thus, the operator is able to select whether the pre-amplifier receives the sagging power supply signal. For amplifiers 10 having additional stages, switch 57 or one or more additional switch control whether other pre-amplifier stages receive the sagging power supply signal. The pre-amplifier stages are selected to receive the sagging power supply signal 14 as a whole, individually or in groups according to various embodiments.

The pre-amplifier stage shown in FIG. 6 includes two channels. Pre-amplifier A (part 51) forms one channel (e.g., channel A). Pre-amplifier B (part 53) forms another channel (e.g., channel B). An operator selects one of the two channels A, B to be active at a given time by positioning a switch 59. According to an aspect of this invention, the switch 59 is coupled to another switch 61 (corresponding to switch 2110 of the FIG. 3 embodiment and switch 2242 of the FIG. 5 embodiment). Switch 61 moves between positions with switch 59. Switch 61 selects which sag magnitude control 26a or 26b is active. Sag magnitude control 26a is used while the channel for pre-amplifier A is active. Sag magnitude control 26b is used while the channel for pre-amplifier B is active. An advantage of having the separate sag magnitude controls 26a, 26b is that an operator can preset the sag magnitude for each channel. During a live performance, for example a musician can then switch channels and have the sag cutoff control already set. Thus, the musician need not adjust the setting in the middle of a song, or if desired, during a performance.

Meritorious and Advantageous Effects

Although preferred embodiments of the invention have been illustrated and described, various alternatives, modifications and equivalents may be used. There are a number of alternative amplifier configurations, regulator types, and sag generator circuits that can be used. The specific circuits shown are not meant to be an exhaustive list of circuits to which the present invention could be applied. Therefore, the foregoing description should not be taken as limiting the scope of the inventions which are defined by the appended claims.

What is claimed is:

1. An electronic power supply control system for controlling a power signal, comprising:

a power supply generating a power supply signal;

an amplifier which is adapted to receive the controlled power signal and an input signal, the amplifier amplifying the input signal to generate an output signal to a load;

a measuring circuit which measures an observed signal and generates in response a measured signal;

a sag control circuit which receives the measured signal and generates in response a sag control signal; and a regulator circuit which receives the power supply signal and the sag control signal and generates in response a regulated power signal which is output to the amplifier as the controlled power signal, wherein the regulator circuit decreases the maximum power available to the amplifier as the sag control signal level magnitude increases, thereby producing increased distortion and compression in the output signal; and wherein the sag control circuit comprises means for defining a cutoff voltage level for the sag control signal to limit crossover distortion.

2. The system of claim 1, in which the defining means is not adjustable.

3. The system of claim 1, in which the amplifier comprises a pre-amplifier stage and a power amplifier stage, and further comprising a switch having a first setting in which the pre-amplifier stage receives the regulated power signal from the regulator circuit and a second setting in which the pre-amplifier stage receives a power signal from other than the regulator circuit.

4. The system of claim 1, in which the amplifier comprises a first channel and a second channel wherein no more than one channel serves to drive the load at a given time, and further comprising a first switch which selects which channel drives the load, and wherein the sag control circuit further comprises a plurality of sag magnitude controls and a second switch which selects which sag magnitude control is active, wherein the active sag magnitude control defines the maximum magnitude of the sag control signal.

5. The system of claim 4, in which the first switch and second switch are controlled in common, and wherein for each amplifier channel there is a corresponding sag magnitude control, and wherein while the first switch selects the first channel, the second switch selects the sag magnitude control corresponding to the first channel.

6. The system of claim 1, in which the sag control circuit further comprises means for controlling the rate of change of said sag control signal as said sag control magnitude increases and decreases in response to said measured signal.

7. The system of claim 1, in which the observed signal is the output signal from the amplifier.

8. The system of claim 1, further comprising a reference circuit which generates a static reference signal, wherein the regulator circuit receives the static reference signal and generates the regulated power signal in response to the static reference signal, the power supply signal and the sag control signal.

9. The system of claim 1, in which the observed signal is the regulated power signal.

10. The system of claim 1, in which the observed signal is a raw power supply signal generated by the power supply.

11. An electronic power supply control system for controlling a power signal in an electronic circuit having an amplifier and a power supply, the power supply generating a power supply signal, the amplifier adapted to receive a controlled power signal and an input signal, the amplifier amplifying the input signal to generate an output signal to a load, the system comprising:

a measuring circuit which measures an observed signal and generates in response a measured signal;

a sag control circuit which receives the measured signal and generates in response a sag control signal; and a regulator circuit which receives the power supply signal and the sag control signal and generates in response a regulated power signal which is output to the amplifier as the controlled power signal, wherein the regulator circuit decreases the maximum power available to the amplifier as the sag control signal level magnitude increases, thereby producing increased distortion and compression in the output signal; and wherein the sag control circuit comprises means for defining a cutoff voltage level for the sag control signal to limit crossover distortion.

12. A method for controlling a power signal in an electronic circuit having an amplifier and a power supply, the power supply generating a power supply signal, the amplifier adapted to receive a controlled power signal and an input signal, the amplifier amplifying the input signal to generate an output signal to a load, the method comprising the steps of:

measuring an observed signal and generating in response a measured signal;

generating a sag control signal in response to the measured signal and a user adjustable sag control setting;

clipping voltage level of the sag control signal beyond a prescribed magnitude to limit crossover distortion; and regulating the power supply signal generated by the power supply in response to the sag control signal to generate the controlled power signal for the amplifier, wherein the maximum power available to the amplifier is decreased as the sag control signal level magnitude increases, thereby producing increased distortion and compression in the output signal.

13. The method of claim 12, in which the amplifier comprises a pre-amplifier stage and a power amplifier stage, and further comprising the step of selecting a setting for a switch which has a first setting in which the pre-amplifier stage receives the controlled power signal from the regulator circuit and a second setting in which the pre-amplifier stage does not receive the controlled power signal.

14. The method of claim 12, in which the amplifier comprises a first channel and a second channel wherein no more than one channel serves to drive the load at a given time, and further comprising the steps of:

selecting which amplifier channel drives the load;

selecting a sag magnitude control corresponding to the selected amplifier channel, wherein the selected sag magnitude control defines the maximum magnitude of the sag control signal.

15. The method of claim 12, in which the user adjustable sag control setting comprises a control of the rate of change of said sag control signal as said sag control signal level magnitude increases and decreases in response to said measured signal.

16. The method of claim 12, in which the observed signal is the output signal from the amplifier.

17. The method of claim 12, further comprising the step of generating a static reference signal, and wherein the step of regulating comprises generating the controlled power signal in response to the static reference signal, the power supply signal and the sag control signal.

18. The method of claim 12, in which the observed signal is the controlled power signal.

19. The method of claim 12, in which the observed signal is the power supply signal generated by the power supply.

20. An electronic power supply control circuit for an electronic circuit having an amplifier and at least one power supply, the amplifier being adapted to receive a power supply current from the power supply and an input signal from an input signal source, and to supply a corresponding amplified output signal to a load, the control circuit comprising:

a measuring circuit for measuring an observed signal and generating a sag control signal in response to said measured signal;

a sag control circuit for receiving said measured signal and generating a sag control signal in response to said measured signal;

means for regulating the power supply, said regulating means receiving said sag control signal and a power supply current from the power supply, and generating a regulated power supply current for the amplifier in response to said sag control signal, whereby as the sag control signal magnitude increases, said regulating means decreases the maximum power available to the amplifier, thereby producing increased distortion and compression in the output signal.

21. The control circuit of claim 20, wherein said sag control circuit comprises means for adjustably controlling the maximum value of said sag control signal.

22. The control circuit of claim 20, further including means for controlling the rate of change of said sag control signal as said sag control magnitude increases and decreases in response to said measured signal.

23. The control circuit of claim 20, wherein said observed signal is the output signal from the amplifier.

24. The control circuit of claim 20, in which the amplifier has a first channel and a second channel wherein no more than one channel serves to drive the load at a given time, and further comprising a first switch which selects which channel drives the load, a plurality of sag magnitude controls and a second switch which selects which sag magnitude control is active, wherein the active sag magnitude control defines the maximum magnitude of the sag control signal, wherein the first switch and second switch are controlled in common, wherein for each amplifier channel there is a corresponding sag magnitude control, and wherein while the first switch selects the first channel, the second switch selects the sag magnitude control corresponding to the first channel.

25. The control circuit of claim 20, wherein said observed signal is said regulated power supply current received in the amplifier.

26. The control circuit of claim 20, wherein said observed signal is the raw power supply current generated by the power supply.

27. A method for controlling an electronic power supply in an electronic amplifier circuit having an amplifier and at least one power supply, the amplifier being adapted to receive a power signal from at least one power supply and an input signal from an input signal source, and to generate an amplified output signal, the method comprising the steps of:

monitoring an observed signal in the electronic amplifier circuit and generating a measured signal in response thereto;

generating a sag control signal in response to the measured signal;

regulating the power supply signal in response to the sag control signal such that as the sag control signal magnitude increases, the maximum power available to the amplifier decreases, thereby producing increased distortion and compression in the output signal.

28. The method of claim 27, wherein said step of generating a sag control signal further includes adjustably controlling the maximum magnitude of the sag control signal.

29. The method of claim 27, wherein said step of generating a sag control signal further includes control of the rate of change of the sag control signal as the sag control signal magnitude increases and decreases in response to the measured signal.

30. The method of claim 27, in which the amplifier has a first channel and a second channel wherein no more than one channel serves to drive the load at a given time, and further comprising the steps of:

selecting which amplifier channel drives the load;

selecting a sag magnitude control corresponding to the selected amplifier channel, wherein the selected sag magnitude control defines the maximum magnitude of the sag control signal.

\* \* \* \* \*